United States Patent [19]
Allen et al.

[11] Patent Number: 6,043,538
[45] Date of Patent: Mar. 28, 2000

[54] DEVICE STRUCTURE FOR HIGH VOLTAGE TOLERANT TRANSISTOR ON A 3.3 VOLT PROCESS

[75] Inventors: Michael J. Allen; Stephen F. Sullivan, both of Rescue, Calif.

[73] Assignee: Intel Corporation, Santa Clara, Calif.

[21] Appl. No.: 08/367,917

[22] Filed: Jan. 3, 1995

Related U.S. Application Data

[63] Continuation of application No. 08/129,767, Sep. 30, 1993, abandoned.

[51] Int. Cl.[7] .................................................. H01L 23/62
[52] U.S. Cl. .......................... 257/355; 257/360; 257/368
[58] Field of Search ................................... 257/344, 408, 257/500, 360, 355, 314, 368

[56] References Cited

U.S. PATENT DOCUMENTS

| | | | |
|---|---|---|---|
| 4,918,026 | 4/1990 | Kosiak et al. | 257/408 |
| 4,922,311 | 5/1990 | Lee et al. | 257/344 |
| 5,016,077 | 5/1991 | Sato et al. | 257/408 |
| 5,239,197 | 8/1993 | Yamamoto | 257/500 |

FOREIGN PATENT DOCUMENTS

| | | | |
|---|---|---|---|
| 0184222 | 6/1986 | European Pat. Off. | 257/408 |
| 57-162466 | 10/1982 | Japan | 257/360 |
| 2-238668 | 9/1990 | Japan | 257/360 |

OTHER PUBLICATIONS

Krick et al., "Integratable, Symmetrical, High–Voltage MOSFET Structure," IBM Technical Disclosure Bulletin, vol. 15, No. 6, Nov. 1972, p. 1884–1885.

*Primary Examiner*—Mahshid Saadat
*Assistant Examiner*—Huy Bui
*Attorney, Agent, or Firm*—Blakely, Sokoloff, Taylor & Zafman LLP

[57] ABSTRACT

An integrated circuit which includes a first transistor device portion having an N+ doped region drain terminal in an N– well in a P– substrate, an N+ doped region source terminal in the P– substrate, and a gate separated from the source and drain regions by a layer of silicon dioxide; and a second transistor device portion including an N+ doped region drain terminal in the P– substrate, an N+ doped region source terminal in the P– substrate, and a gate separated from the source and drain regions by a layer of silicon dioxide; conductive means connecting the drain region of the first transistor device portion to a node to be discharged, a conductor connecting the gate of the first transistor device portion to a source of biasing potential equal to the source voltage used in a low voltage process, another conductor connecting the source of the second transistor device portion to a source of ground potential; and a third conductor for providing a source of positive input potential to the gate terminal of the second transistor device portion. The enabling of the second transistor device portion enables the first transistor device portion and discharges the node without causing breakdown of the silicon dioxide layers or any junction of the first and the second transistor device portions because the large N well distributes the high voltage over a number of junctions so that no junction sees a breakdown voltage.

13 Claims, 3 Drawing Sheets

DEVICE STRUCTURE FOR HIGH VOLTAGE TOLERANT TRANSISTOR ON A 3.3 VOLT PROCESS

This is a continuation of application Ser. No. 08/129,767, filed Sep. 30, 1993 abandoned.

BACKGROUND OF THE INVENTION

1. Field Of The Invention

This invention relates to computer systems and, more particularly, to methods and apparatus for switching high voltages in circuitry manufactured by processes typically used to provide low voltage tolerant integrated circuitry.

2. History Of The Prior Art

A major trend in the manufacture of personal computers is toward portable computers which are able to provide most of the abilities of desktop computers but are packaged in very small and light packages. In order to accomplish this, such portable computers must provide the large storage capacity and the processor speed necessary to run large programs. A typical prior art portable computer uses a great deal of power in order to meet these requirement.

At the same time, computer designers are modifying the components used in such portable computers so that the computers are able to run for long periods while consuming very small amounts of power. In order to reduce power consumption and extend battery life, much of the integrated circuitry used in portable computers is being redesigned to run at low voltage levels. This reduces the power usage and allows more components to be placed closer to one another in the circuitry. The modern circuitry and components used in portable computers are being designed to operate at 3.3 volt levels. This helps a great deal to reduce the power needs of portable computers. Part of this redesign reduces the thickness and size of the various layers, regions, and conductors utilized in order to reduce the size and power consumption of the various components used in the integrated circuits However, at the same time, the desire to make portable computers offer all of the advantages of desktop computers opposes this salutary result. Many of the advantages offered by desktop computers require higher voltages to function. For example, one real convenience is the ability to change the BIOS processes as improvements in the computer or its peripherals occur. Historically, this has been accomplished by removing the EPROM or similar circuitry providing the read only memory for storing the BIOS processes and replacing it with new circuitry at additional cost. This is a complicated operation beyond the abilities of many computer users. Recently, flash electrically-erasable programmable read only memory (EEPROM memory) has been used to store BIOS processes. This memory may be reprogrammed without removing the BIOS circuitry from the computer by running a small update program to reprogram the BIOS circuitry when the BIOS processes change. However, reprogramming flash EEPROM memory requires from seven to twelve volts to accomplish. The integrated circuits designed for low voltage use are typically not able to tolerate such high voltages without physical damage.

Another form of flash EEPROM memory array provides another example of high voltage requirements in portable computers. Recently, a new form of long term random access storage has been devised using flash EEPROM memory arrays. An example of a flash EEPROM memory array which may be used in place of a hard disk drive is given in U.S. patent application Ser. No. 07/969,131, entitled *A Method and Circuitry For A Solid State Memory Disk,* S. Wells, filed Oct. 31, 1992, and assigned to the assignee of the present invention. These arrays provide a smaller lighter functional equivalent of a hard disk drive which operates more rapidly and is not as sensitive to physical damage. Such memory arrays are especially useful in portable computers where space is at a premium and weight is extremely important. However, these flash EEPROM memory arrays also require much higher voltages for writing and erasing data than can be tolerated by prior art integrated circuitry adapted to operate at low voltages. Consequently, portable computers using low voltage circuitry have not been able to utilize these modern advantages.

Recently various circuitry has been devised to allow certain high power operations to be accomplished within integrated circuits designed for processes typically used for low power circuitry. For example, voltage pump circuitry has been designed for providing higher 10 and 12 volt levels in semiconductor circuitry designed for a 3.3 volt process. One of the problems discovered in attempting to utilize such circuitry is that it is difficult to discharge nodes raised to higher voltage levels because of the lower levels of voltage and current which the circuitry designed for a low voltage process will tolerate.

SUMMARY OF THE INVENTION

It is, therefore, an object of the present invention to provide circuitry by which various circuit operations requiring high voltage may be carried out with integrated circuitry which is designed for low voltage operations.

It is another, more specific, object of the present invention to provide a circuit for discharging high voltages from various nodes of integrated circuitry designed for low voltage usage.

These and other objects of the present invention are realized in an integrated circuit which includes a first transistor device comprising an N+ doped region drain terminal in a large N− well in a P− substrate, an N+ doped region source terminal in the P− substrate, and a gate terminal separated from the source and drain regions by a layer of silicon dioxide; and a second transistor device comprising an N+ doped region drain terminal in the P− substrate, an N+ doped region source terminal in the P− substrate, and a gate separated from the source and drain regions by a layer of silicon dioxide; conductive means connecting the drain region of the first transistor to a node to be discharged, conductive means connecting the gate of the first transistor to a source of biasing potential equal to the source voltage used in a low voltage circuitry in the same integrated circuit, conductive means connecting the source of the second transistor to a source of ground potential; and means for providing a signal to the gate terminal of the second transistor to initiate conduction of the first and second transistors and discharge a high voltage at the node. The large N− well in which the drain of the first transistor is deposited distributes the high voltage at the node over a plurality of gradual junctions so that the first and second transistors may be enabled and discharge the node without causing breakdown of the silicon dioxide layers or any junction of the first and the second transistor.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to apparatus for operating a computer in processing electrical or other (e.g. mechanical, chemical) physical signals to generate other desired physical signals.

DETAILED DESCRIPTION

Figure 1:
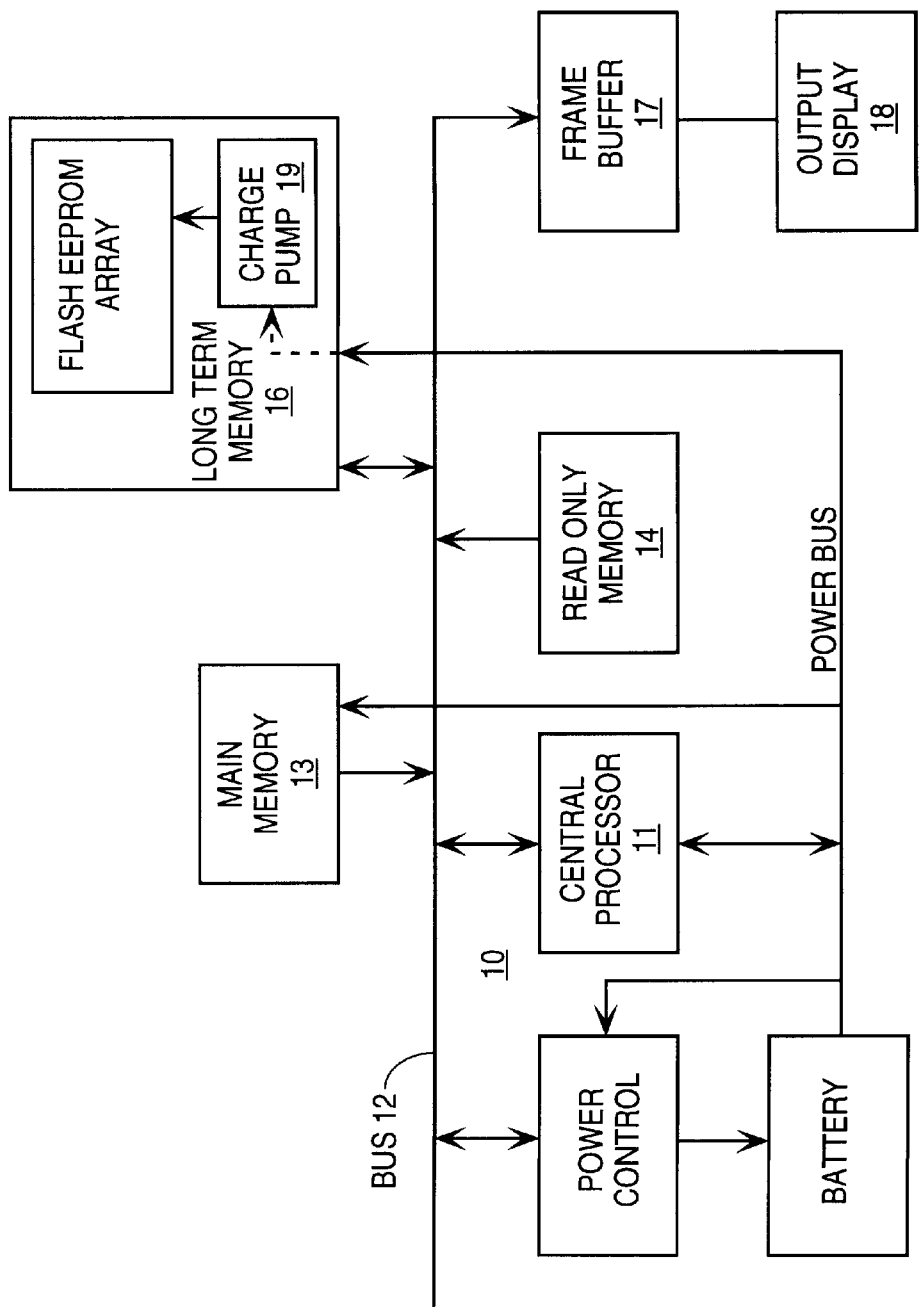
FIG. 1 is a block diagram illustrating a computer system including the present invention.

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also joined to the bus 12 is read only memory 14 which may include various memory devices well known to those skilled in the art each of which is adapted to retain a particular memory condition in the absence of power to the system 10. The read only memory 14 typically stores various basic functions used by the processor 11 such as basic input/output processes and startup processes typically referred to as BIOS processes. Such memory 14 may be constructed of flash EEPROM memory cells adapted to be modified as various ones of the BIOS processes used by a particular computer are changed. If the memory 14 is constructed of flash EEPROM memory cells, it may be modified by running an update process on the computer itself to reprogram the values stored in the memory 14.

Also connected to the bus 12 are various peripheral components such as long term memory 16. The construction and operation of long term memory 16 (typically electro-mechanical hard disk drives) is well known to those skilled in the art. However, rather than the typical electro-mechanical hard disk drive, a flash EEPROM memory array may be used as the long term memory 16. Such flash EEPROM memory arrays are programmed and erased through techniques which utilize voltages greater than the 3.3 volts available to the integrated circuits of more advanced portable computers. A charge pump 19 is illustrated as a portion of memory 16 for generating such higher voltages. Also joined to the bus 12 is circuitry such as a frame buffer 17 to which data may be written which is to be transferred to an output device such as a monitor 18 for display.

Figure 2:
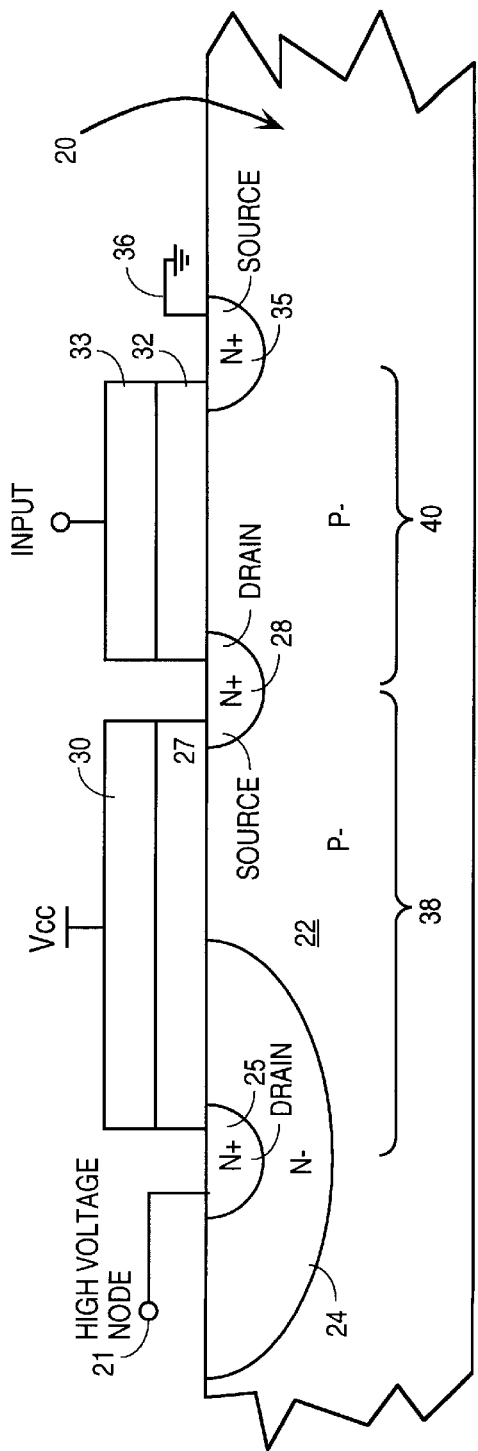
FIG. 2 is a cross-sectional drawing illustrating a side view of the construction of a pair of transistor devices which may be used in accordance with the present invention.

FIG. 2 is a cross-sectional view of a transistor device 20 designed in accordance with the present invention. The device 20 may be constructed in a manufacturing process which utilizes conventional CMOS techniques. The present invention is adapted to be used with such a process which is designed to provide circuitry constructed to function at low power levels. Such circuitry typically includes integrated circuits basically comprised of N channel field effect transistor devices capable of running at source voltages of 3.3 volts. A manufacturing process of this sort typically provides oxide insulating coatings which are approximately 70 angstroms in thickness. Such coatings are able to withstand voltages of approximately seven to eight volts without being subject to electron tunneling which tends to break down and destroy the oxide layer and the effectiveness of the devices. This level of voltage is relatively low compared to the voltage levels of from seven to twelve volts used to program and erase flash EEPROM memory arrays. These voltages which are used to program and erase flash EEPROM memory arrays and similar circuitry often place integrated circuit nodes at voltages of from seven to twelve volts, and such nodes require discharge during various stages of operation.

Not only is the voltage tolerance of the oxide layers of the typical integrated circuitry described above much lower than the voltages required to program and erase flash EEPROM memory arrays, a manufacturing process of this sort produces semiconductor junctions which are able to withstand various levels of breakdown voltages which are less than the voltages required to program and erase flash EEPROM memory arrays and which must be discharged. The various levels of breakdown voltages at semiconductor junctions produced by such a low voltage process depend on the particular doping of the layers and the abruptness of each junction profile. For example, a junction in which both the N and P regions are highly doped produces a sharp N+ to P+ junction (where the plus sign signifies a high level of doping) between regions which may be able to withstand voltages of only from a few volts without breakdown. A junction between N+ and P– regions, on the other hand, may be able to withstand voltages of from seven to nine volts without breakdown, while a junction between N– and P– regions may be able to withstand voltages of approximately twenty volts. Various junctions may exist over large areas and able to withstand relatively large voltage differences, while other junctions may be concentrated in very small areas and able to withstand lesser voltage differences. The typical N channel field effect transistor devices produced by the low voltage process described above utilize N+ source and drain connections in a P– substrate; and such devices have an upper limit of seven to nine volts before breakdown.

However, many circuits requiring high voltages have very desirable characteristics which are especially useful in portable computers. For example, flash EEPROM memory arrays are very light in weight, store a great deal of data in a very small space, are not subject to many of the mechanical hazards of hard disk drives, and are much more error free than are hard drives. However, since only low voltages are available from an external source, the high voltage levels must be generated within the low voltage process circuitry. Thus, circuitry such as charge pump circuitry for producing the high levels of voltage necessary to program and erase flash EEPROM memory arrays must be a part of integrated circuits which are designed to operate at 3.3 volts and which suffer both oxide breakdown and junction breakdown at voltages which are lower than some of the voltages which need to be discharged. Consequently, it is very desirable that novel adaptations be found which allow the use of these circuits in arrangements with low voltage process integrated circuitry. This requires that circuitry be provided which is able to discharge the high voltages in circuits produced using processes typically used for producing low voltage circuitry.

As may be seen in FIG. 2, the device 20 is used to discharge a high voltage which may typically be ten volts and which appears at a node labeled 21 in the figure. The device 20 is constructed in the basic P– type silicon substrate material 22 on which are constructed other devices of the low voltage integrated material 22. An N– well 24 is deposited in the silicon material 22, and an N+ region 25 is deposited in the N– well 24. A second N+ region 28 is deposited in the P– substrate 22. A layer of silicon-dioxide insulating material 27 is deposited on the surface of the P– substrate 22 joining to each of the N+ regions 25 and 28, and a polysilicon material 30 may be laid over the oxide material to provide a gate terminal.

Another portion 32 of silicon-dioxide insulating material is deposited on the surface of the substrate 22 joining the region 28, and another N+ region 35 is deposited in the substrate 22. A polysilicon material deposited on the oxide layer 32 may define another gate terminal 33.

A connection 36 may be made to the region 35, typically by a deposited metal layer, by which a voltage level defining ground (often shown as Vss) may be placed at the region 35. Similarly, a conductive connection may be made to the gate terminal 30 for providing a voltage level shown as Vcc in the figure and typically equal to 3.3 volts in the preferred embodiment of the circuitry. Similar conductive connections are made from the high voltage node 21 to the region 25 and from the gate terminal 33 to an input terminal at which a control voltage may be applied. The control voltage is utilized to enable the discharge of the voltage at the node 21 to ground through the device 20.

As FIG. 2 demonstrates, the device 20 is electrically the same as a pair of N type field effect transistor devices shown as device portions 38 and 40. The device portion 38 has its drain defined by the N+ region 25 and its source defined by the N+ region 28. As mentioned, the doped polysilicon material 30 may provide a gate terminal for the device 38. The device portion 40 has its drain defined by the N+ region 28 which defines the source of the device 38 and its source defined by the N+ region 35. The doped polysilicon material 33 may also provide a gate terminal for the device portion 40.

Figure 3:
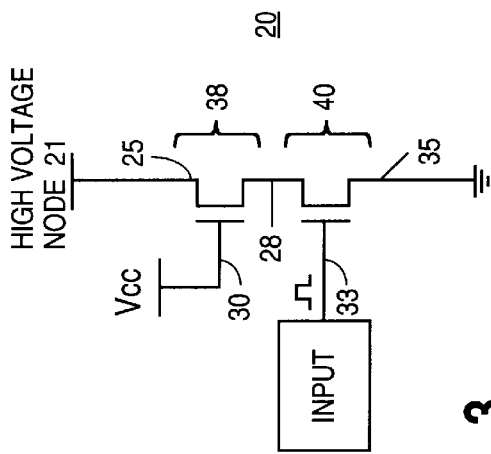
FIG. 3 is a circuit diagram illustrating an arrangement in accordance with the invention for switching high voltages in an integrated circuit designed for low voltages.

A block diagram illustrating the electrical operation of the device 20 is shown in FIG. 3. The node 21 which is joined to the region 25 typically charges to a high voltage value (typically ten to twelve volts) during the operation of the integrated circuit of which the device 20 is a part. The manufacturing processes by which the device 20 is manufactured produce in the integrated circuitry silicon dioxide insulating layers and transistor junctions which are normally not able to withstand voltages of this value. As will be understood, the discharge of the node 21 is initiated by the application of an input signal, a positive voltage applied to the gate terminal 33 of the device 20. This signal turns on the portion of the device 20 which is referred to above as device portion 40. As this portion of the device 20 turns on, the potential at the region 28 lowers to ground, bringing the portion of the device 20 referred to as device portion 38 into conduction and allowing the discharge of the voltage at the node 21.

The foregoing arrangement of the device 20 allows a high voltage such as ten volts applied at the drain terminal 25 of one N channel device portion 38 to be shorted to ground through the source terminal 35 of the other N channel device portion 40 without producing a voltage larger than that which the integrated circuit is designed to tolerate across any junction between two differently doped regions or across any silicon dioxide layer of the two transistor device portions 38 and 40. By constraining the gate voltage of the device portion 38 to remain at Vcc while the device portion 40 is first switched and then allowing the source voltage to switch the device portion 38 on as the device portion 40 comes on, potentials are maintained which the transistors can tolerate. For example, in the arrangement shown in FIG. 2, the voltage between the gate terminal 30 and the drain terminal 25, and thus across the silicon dioxide layer 27 which separates those regions of the device portion 38, can never be greater than just less than 7 volts when the node 21 is fully charged to 10 volts. Similarly, the voltage between the gate terminal 30 and the source terminal 28 of the device portion 38 and across the silicon dioxide layer which separates those regions can never be greater than 3.3 volts in the conducting condition of the device portion 40 when ground is at the terminal 28.

Similarly, except across the boundary between the first N+ region 25, the N– well 24, and the P– substrate, the voltage across none of the semiconductor boundaries is greater than from three to four volts, an amount insufficient to cause breakdown of the P– to N+ junctions, during any operating condition of these devices. The potential at the node 21 may be ten volts and if the value at the P– substrate is ground, then ten volts will be placed across the double junction including the first N+ region 25, the N– well 24, and the P– substrate. However, since the junction between N– and P+ is a gradual rather than a sharp junction, it is not subject to breakdown by this level of voltage. If the device portion 40 is on so that ground is at the source region 28, ten volts will appear between the regions 25 and 28; but this ten volts will be distributed along the channel. The channel is made long enough, typically greater than four microns, to prevent punch through. The potential drop along the N– portion of the channel prevents the remainder of the channel from seeing potentials great enough to cause breakdowns to the P– substrate region.

The N channel transistor device portion 38 is always biased by the potential Vcc and thus will act as a high voltage block for node 28. Node 28 can never rise above Vcc minus the threshold voltage Vtn. Consequently, the junctions between the region 28 and the substrate 22 and between the substrate 22 and the region 35 can never see voltages too high to tolerate in any condition of the device 20. Consequently, the transistor device portions 38 and 40 are well able to handle the high voltages furnished without any breakdown of the junctions or the silicon dioxide insulating layer.

Figure 4:
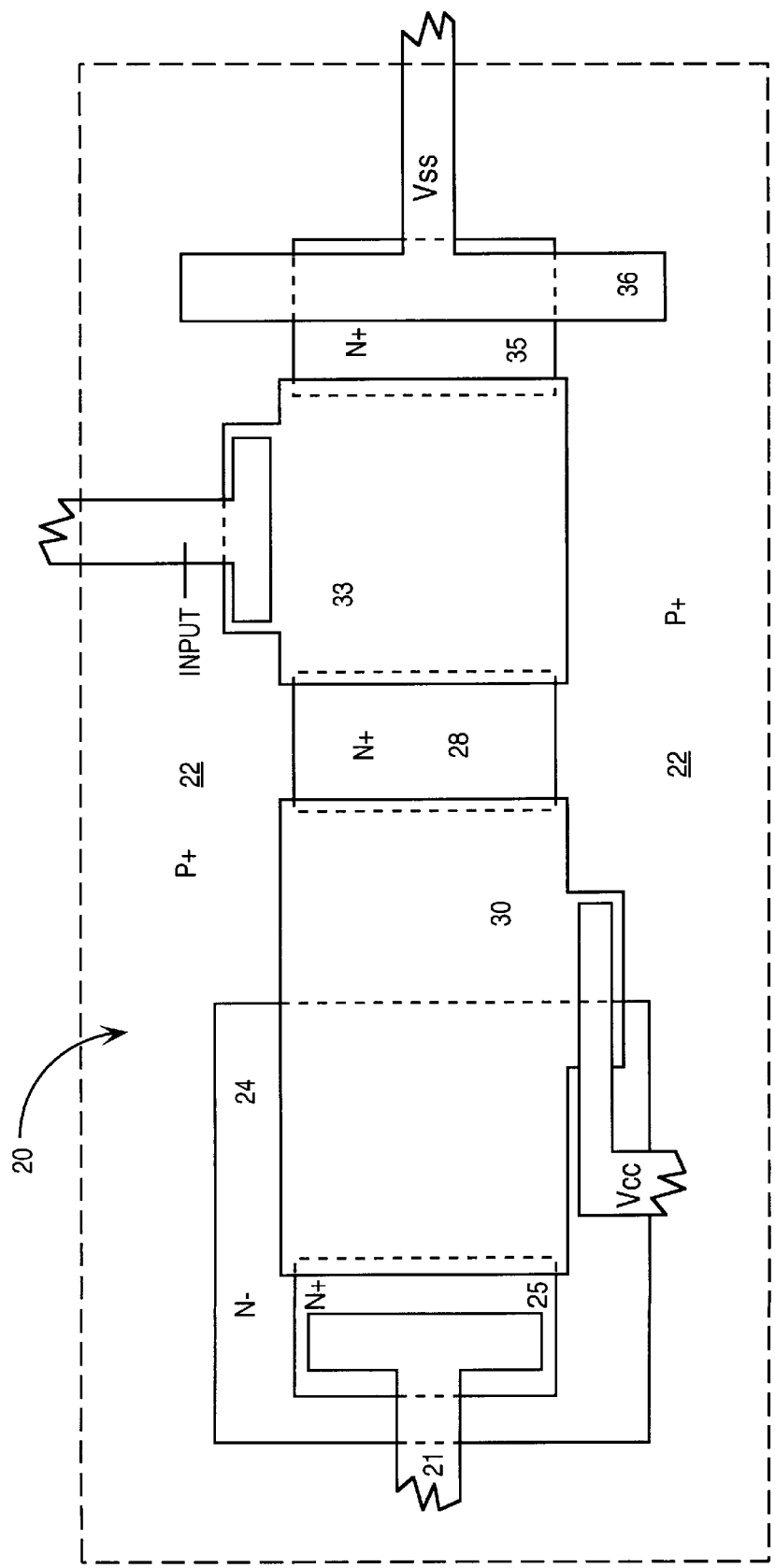
FIG. 4 is a top view of a manufacturing layout for a device such as that illustrated in FIG. 3 for practicing the invention.

FIG. 4 illustrates a top view of the layout of an integrated circuit device 20 designed in accordance with the present invention. The device 20 shown from the top demonstrates best the arrangement of the gate terminal layers 30 and 33. Also apparent from this view are the N– well 24 and the N+ region 25 deposited in that well 24. As may be seen, the node 21 appears to the left in FIG. 4 and connects to the region 25. The gate 30 is joined to Vcc by a doped polysilicon (or metallic) conductor. The gate terminal 33 is similarly joined to the input by another doped polysilicon (or metallic) conductor. The region 35 can be seen to connect to ground (Vss) to the right in FIG. 4.

Thus, there has been disclosed a transistor device by which high voltages may be switched to ground in integrated circuits, the transistor devices of which are designed for use with much lower voltage levels.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A low voltage integrated circuit comprising:
   a P– doped substrate material;
   a first transistor device having
      an N– doped well region in the P– substrate material,
      an N+ doped drain terminal region in the N– well region,
      an N+ doped source terminal region in the P– substrate material, and
      a gate separated from the source and drain terminal regions by a layer of silicon dioxide;
   a second transistor device having
      an N+ doped drain terminal region in the P– substrate material, the N+ doped drain terminal region joining the N+ doped source terminal region of the first transistor device,
      an N+ doped source terminal region in the P– substrate material, and
      a gate separated from the source and drain terminal regions by a layer of silicon dioxide;
   first conductive means connecting the drain terminal region of the first transistor device to a high voltage node to be discharged, wherein the high voltage node has a voltage of approximately 7–12 volts;
   second conductive means connecting the gate of the first transistor device to a biasing potential equal to an operating voltage of approximately 3 volts used in a low voltage integrated circuit,
   third conductive means connecting the source terminal region of the second transistor device to a ground potential; and
   means for providing a positive input potential to the gate of the second transistor device to enable the first and second transistor devices and discharge the high voltage node without causing breakdown of the silicon dioxide layers or any junction of the first and the second transistor devices.

2. A low voltage integrated circuit as claimed in claim 1 in which the means for providing a source of positive input potential to the gate of the second transistor device to enable the first and second transistor devices and discharge the node without causing breakdown of the silicon dioxide layers or any junction of the first and the second transistor devices comprises
   means cooperating with the source of biasing potential joined to the second conductive means connected to the gate of the first transistor device to limit the voltage across the layer of silicon dioxide of the second transistor device.

3. A low voltage integrated circuit switch comprising
   a P– substrate
   a first transistor device having
      an N– doped well region in the P– substrate,
      an N+ doped drain terminal region in the N– well,
      an N+ doped source terminal region in the P– substrate, and
      a gate overlying a portion of each of the source and drain terminal regions and separated therefrom by a layer of silicon dioxide, the N– doped well region extending a significant distance under the layer of silicon dioxide whereby the N– well provides a gradual junction between the N+ drain region and the P– substrate such that a channel length between the N+ drain terminal region and the N+ source terminal region of the first transistor is sufficiently long enough to prevent punchthrough when a potential of approximately 7–12 volts is applied between the drain region and the source region;
   a second transistor device having
      an N+ doped drain terminal region in the P– substrate,
      an N+ doped source terminal region in the P– substrate, and
      a gate separated from the source and drain terminal regions by a layer of silicon dioxide; and
   a means for biasing the first transistor and the second transistor such that a high voltage node, connected to the N+ doped drain terminal region in the N– well, with a voltage of approximately 7–12 volts, is discharged to ground.

4. A low voltage integrated circuit switch as claimed in claim 3 in which the N+ doped source terminal region in the P– substrate of the first transistor device and the N+ doped drain terminal region in the P– substrate of the second transistor device are joined together.

5. A low voltage integrated circuit switch as claimed in claim 3 wherein the means for biasing the first transistor device and the second transistor device comprises:
   a biasing potential of approximately 3 volts connected to the gate of the first transistor device, and
   a positive input potential adaptable to be connected to the gate of the second transistor device,
   the biasing and positive input potentials being chosen such that the voltage between the gate and source terminal and the voltage between the gate and drain terminal of the first transistor device are insufficient to cause breakdown of the oxide layer of the first transistor device,
   the voltage between the gate of the first transistor device and the substrate is insufficient to cause breakdown of a junction between any of the regions of the first transistor device,
   the voltage between the gate and source terminal and the voltage between the gate and drain terminal of the second transistor device are insufficient to cause breakdown of the oxide layer of the second transistor device, and the voltage between the gate of the second transistor device and the substrate is insufficient to cause breakdown of a junction between any of the regions of the second transistor device.

6. A computer system comprising:

a processor;

a memory circuit; and a low voltage integrated circuit designed for processes utilizing an operating voltage approximately equal to 3 volts;

the low voltage integrated circuit comprising a switching circuit designed for discharging a high voltage node with a voltage of approximately 7–12 volts, the switching circuit comprising first and second N channel field effect transistor devices, wherein the first N channel field effect transistor device comprises:

a drain terminal being a N+ doped region situated in a N– well deposited in a P– substrate material, a source terminal being a N+ doped region situated in the P– substrate material, and a gate terminal overlying a portion of each of the source terminal and the drain terminal and a substantial portion of the N– well such that a channel length between the N+ drain terminal region and the N+ source terminal region of the first transistor is sufficiently long enough to prevent punchthrough when a potential of approximately 7–12 volts is applied between the drain region and the source region, the second N channel field effect transistor device comprises:

a drain terminal being an N+ doped region situated in the P– substrate material, a source terminal being an N+ doped region situated in the P– substrate material, and a gate terminal overlying a portion of each of the source terminal and the drain terminal, the source and drain terminals of each of the first and second N channel transistor devices being connected in series between the high voltage node and an output terminal connected to ground, and a means for biasing the first transistor and the second transistor such that the high voltage node, connected to the N+ doped drain terminal region in the N– well, with a voltage of approximately 7–12 volts, is discharged to ground; and a system bus for transferring data and addresses between the processor and the memory circuit, the processor, the memory circuit, and the integrated circuit coupled to the system bus.

7. A computer system as claimed in the claim 6 in which the source terminal of the first transistor device and the drain terminal of the second transistor device lie in the same N+ doped region.

8. A computer system as claimed in claim 6 in which the means for biasing the first transistor device and the second transistor device comprises:

a biasing potential of approximately 3 volts joined to the gate of the first transistor device for fixing that terminal at a potential during conduction at which breakdown of junctions of the first transistor device do not occur, and a positive input potential capable of being switched to the gate of the second transistor device for operating the second transistor device without raising a potential at the source terminal of the first transistor device to a point at which junction breakdown occurs in the first transistor device.

9. A computer system comprising:

a central processor;

a memory arrangement comprising a flash EEPROM memory array including a plurality of floating gate field effect transistor devices;

a charge pump, wherein the charge pump provides a high voltage of approximately 7–12 volts to the floating gate field effect transistor devices;

a low voltage integrated circuit switch comprising a P– substrate;

a first transistor device having an N– doped well region in a P– substrate, an N+ doped drain terminal region in the N– well, an N+ doped source terminal region in the P– substrate, and a gate overlying a portion of each of the source and drain terminal regions and separated therefrom by a layer of silicon dioxide, the N– doped well region extending a significant distance under the layer of silicon dioxide whereby the N– well provides a gradual junction between the N+ drain region and the P– substrate such that a channel length between the N+ drain terminal region and the N+ source terminal region of the first transistor is sufficiently long enough to prevent punchthrough when a potential of approximately 7–12 volts is applied between the drain region and the source region;

a second transistor device having an N+ doped drain terminal region in the P– substrate, an N+ terminal doped source terminal region in the P– substrate, and a gate separated from the source and drain terminal regions by a layer of silicon dioxide;

a means for biasing the first transistor and the second transistor such that a high voltage node, connected to the N+ doped drain terminal region in the N– well, with a voltage of approximately 7–12 volts, is discharged to ground; and a system bus for transferring data and addresses between the central processor and the memory arrangement.

10. A computer system as claimed in claim 9 in which the N+ doped source terminal region in the P– substrate of the first transistor device and the N+ doped drain terminal region in the P– substrate of the second transistor device are joined together.

11. A computer system as claimed in claim 9 wherein the means for biasing the first transistor device and the second transistor device comprises:

a biasing potential of approximately 3 volts joined to the gate of the first transistor device for fixing that terminal at a potential at which breakdown of junctions of the first transistor device do not occur, and a positive input potential capable of being switched to the gate of the second transistor device for operating the second transistor device without raising a potential at the source terminal of the first transistor device to a point at which junction breakdown occurs in the first transistor device.

12. A low voltage integrated circuit switch comprising
a P– substrate;
- an N– doped well region in the P– substrate,
- an N+ doped terminal region in the N– well,
- a first N+ doped terminal region in the P– substrate,
- a second N+ doped terminal region in the P– substrate,
- a first gate overlying a portion of each of the N+ doped region in the N– well and the first N+ doped terminal region and separated therefrom by a layer of silicon dioxide, the N– doped well region extending a significant distance under the layer of silicon dioxide whereby the N– well provides a gradual junction between the N+ drain region and the P– substrate such that a channel length between the N+ terminal region in the N– well and the first N+ terminal region in the P– substrate is sufficiently long enough to prevent punchthrough when a potential of approximately 7–12 volts is applied between the N+ doped terminal region in the N– well and the first N+ doped terminal region in the P– substrate,
- a second gate overlying a portion of each of the first N+ doped terminal region and the second N+ doped terminal region and separated therefrom by a layer of silicon dioxide, and
- a means for biasing the first gate and the second gate such that a high voltage node, connected to the N+ doped drain terminal region in the N– well, with a voltage of approximately 7–12 volts, is discharged to ground.

13. A low voltage integrated circuit switch as claimed in claim 12 wherein the means for biasing the first gate and the second gate comprises:
- a biasing potential of approximately 3 volts connected to the first gate, and
- a positive input potential adaptable to be connected to the second gate,
  - the biasing and positive input potentials being chosen such that the voltage between the first gate and the N+ doped well region in the N– well and the voltage between the first gate and the first N+ doped well region in the P– substrate are insufficient to cause breakdown of the oxide layer of the first gate,
  - the voltage between the first gate and the P– substrate is insufficient to cause breakdown of the junctions of the integrated circuit switch,
  - the voltage between the second gate and the first N+ doped well region in the P– substrate and the voltage between the second gate and the second N+ doped well region in the P– substrate are insufficient to cause breakdown of the oxide layer of the second gate, and
  - the voltage between the second gate and the P– substrate is insufficient to cause breakdown of any junction of the low voltage integrated circuit switch.

* * * * *